US009602108B1

(12) United States Patent
Gaide et al.

(10) Patent No.: US 9,602,108 B1
(45) Date of Patent: Mar. 21, 2017

(54) LUT CASCADING CIRCUIT

(71) Applicant: Xilinx, Inc., San Jose, CA (US)

(72) Inventors: Brian C. Gaide, Erie, CO (US); Steven P. Young, Boulder, CO (US); Alireza S. Kaviani, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/852,164

(22) Filed: Sep. 11, 2015

(51) Int. Cl.
*H03K 19/173* (2006.01)
*H03K 19/177* (2006.01)
*H03K 19/00* (2006.01)

(52) U.S. Cl.
CPC ... *H03K 19/17728* (2013.01); *H03K 19/0008* (2013.01); *H03K 19/1776* (2013.01); *H03K 19/17744* (2013.01)

(58) Field of Classification Search
None
See application file for complete search history.

(56) References Cited

U.S. PATENT DOCUMENTS

| | | | | |
|---|---|---|---|---|
| 5,546,018 A * | 8/1996 | New | ................ | G06F 7/503 326/38 |
| 5,869,979 A * | 2/1999 | Bocchino | ......... | H03K 19/17744 326/38 |
| 6,118,300 A * | 9/2000 | Wittig | ................ | H03K 19/1737 326/41 |
| 6,288,568 B1 * | 9/2001 | Bauer | ................ | G11C 19/00 326/39 |
| 6,323,680 B1 * | 11/2001 | Pedersen | ............ | H03K 19/1737 326/38 |
| 6,388,464 B1 * | 5/2002 | Lacey | ................ | H03K 19/1776 326/40 |
| 6,747,480 B1 * | 6/2004 | Kaptanoglu | ....... | H03K 19/1737 326/41 |
| 7,391,236 B2 * | 6/2008 | Lewis | ................ | G11C 7/1045 326/40 |
| 7,746,106 B1 * | 6/2010 | Gaide | ................ | H03K 19/1736 326/38 |
| 2001/0045844 A1 * | 11/2001 | New | ................ | H03K 19/17728 326/38 |
| 2002/0186044 A1 * | 12/2002 | Agrawal | ............ | H03K 19/1737 326/41 |
| 2003/0234667 A1 * | 12/2003 | Digari | ................ | H03K 19/1737 326/39 |
| 2005/0127944 A1 * | 6/2005 | Lewis | ................ | H03K 19/1737 326/41 |

(Continued)

*Primary Examiner* — Crystal L Hammond
(74) *Attorney, Agent, or Firm* — Robert Brush

(57) ABSTRACT

In an example, a LUT for a programmable integrated circuit (IC) includes a plurality of input terminals, and a cascading input coupled to at least one other LUT in the programmable IC. The LUT further includes LUT logic having a plurality of LUTs each coupled to a common set of the input terminals. The LUT further includes a plurality of multiplexers having inputs coupled to outputs of the plurality of LUTs, and an output multiplexer having inputs coupled to outputs of the plurality of multiplexers. The LUT further includes a plurality of cascading multiplexers each having an output coupled to a control input of a respective one of the plurality of multiplexers, each of the plurality of cascading multiplexers comprising a plurality of inputs, at least one of the plurality of inputs coupled to the cascading input.

18 Claims, 6 Drawing Sheets

(56) References Cited

U.S. PATENT DOCUMENTS

| | | | | |
|---|---|---|---|---|
| 2005/0257024 A1* | 11/2005 | Ray | G06F 9/3001 | 712/11 |
| 2005/0275428 A1* | 12/2005 | Schlacter | H03K 19/17736 | 326/41 |
| 2006/0066345 A1* | 3/2006 | Leijten-Nowak | H03K 19/17728 | 326/6 |
| 2006/0195503 A1* | 8/2006 | Swami | G06F 7/523 | 708/620 |
| 2013/0257476 A1* | 10/2013 | Cashman | H03K 19/17728 | 326/38 |
| 2016/0028400 A1* | 1/2016 | Sharpe-Geisler | G06F 17/505 | 326/38 |

* cited by examiner

LUT CASCADING CIRCUIT

TECHNICAL FIELD

Examples of the present disclosure generally relate to electronic circuits and, in particular, to a look-up table (LUT) cascading circuit.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

CLBs within FPGAs can include one or more look-up tables (LUTs). LUTs can be used to implement various combinatorial functions and other logic elements. For large combinatorial functions, many LUTs can be used, requiring LUT-to-LUT connections. LUT-to-LUT connections can be made using the programmable interconnect of the FPGA. However, use of the programmable interconnect can be expensive in terms of resource usage and performance.

SUMMARY

A lookup-table (LUT) cascading circuit is described. In an example, a LUT for a programmable integrated circuit (IC) includes a plurality of input terminals, and a cascading input coupled to at least one other LUT in the programmable IC. The LUT further includes LUT logic having a plurality of LUTs each coupled to a common set of the input terminals. The LUT further includes a plurality of multiplexers having inputs coupled to outputs of the plurality of LUTs, and an output multiplexer having inputs coupled to outputs of the plurality of multiplexers. The LUT further includes a plurality of cascading multiplexers each having an output coupled to a control input of a respective one of the plurality of multiplexers, each of the plurality of cascading multiplexers comprising a plurality of inputs, at least one of the plurality of inputs coupled to the cascading input.

In another example, a programmable IC includes a configuration memory; and at least one configurable logic element (CLE) coupled to the configuration memory. The at least one CLE includes a plurality of. Each of the plurality of LUTs includes an output terminal and a cascading input. A cascading input of a first LUT of the plurality of LUTs is coupled to the output terminal of a second LUT of the plurality of LUTs.

In another example, a method of operating a LUT in a programmable IC includes: coupling a common set of input signals to a plurality of LUTs in LUT logic; coupling a cascade input to each of a plurality of cascading multiplexers, the cascade input coupled to at least one other LUT in the programmable IC; controlling at least one of the plurality of cascading multiplexers to select a signal of the cascade input; and coupling output of the cascading multiplexers to multiplexer logic operable to select among outputs of the plurality of LUTs in the LUT logic.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
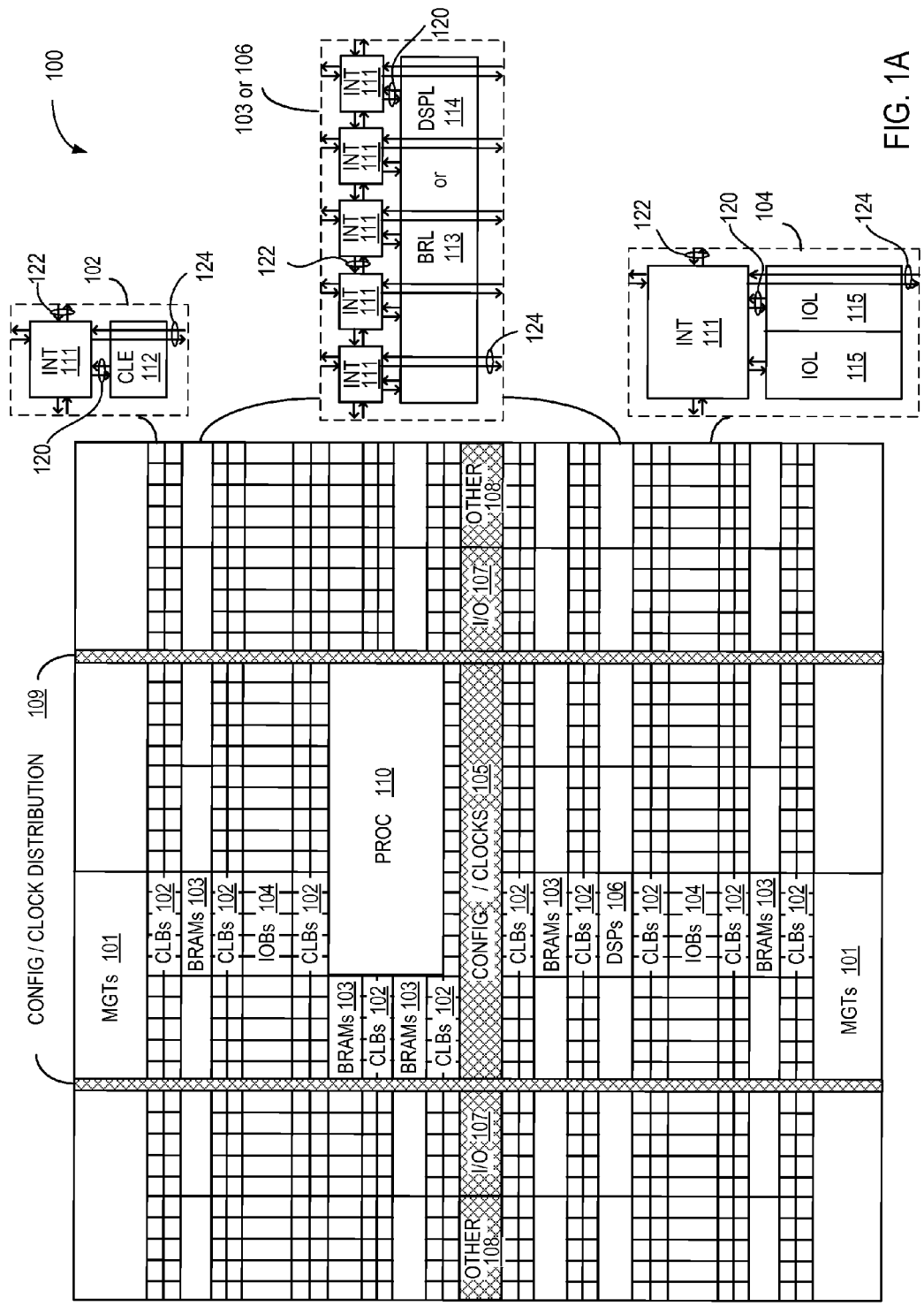
FIG. 1A illustrates an example architecture of an FPGA.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

FIG. 1A illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
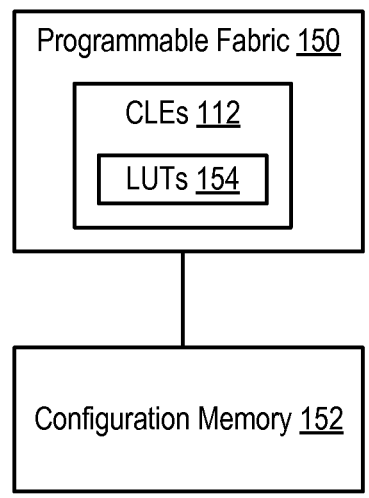
FIG. 1B is a block diagram depicting a higher-level view of the FPGA of FIG. 1A according to an example.

FIG. 1B is a block diagram depicting a higher-level view of the FPGA 100 according to an example. The FPGA 100 includes a programmable fabric 150, which can include the various programmable tiles described above. The programmable fabric 150 is coupled to a configuration memory 152. The configuration memory 152 comprises a random access memory (RAM), such as a static RAM (SRAM) or the like. The programmable fabric 150 can also include CLEs 112 having look-up tables (LUTs) 154. The LUTs 154 can include cascading inputs, as described herein. The configuration memory 152 can be loaded with a configuration bitstream for programming ("configuring") the programmable fabric 150. For example, a configuration bitstream can be loaded into the configuration memory 152 to configure the CLEs 112 of the programmable fabric 150, as described herein.

Figure 2:
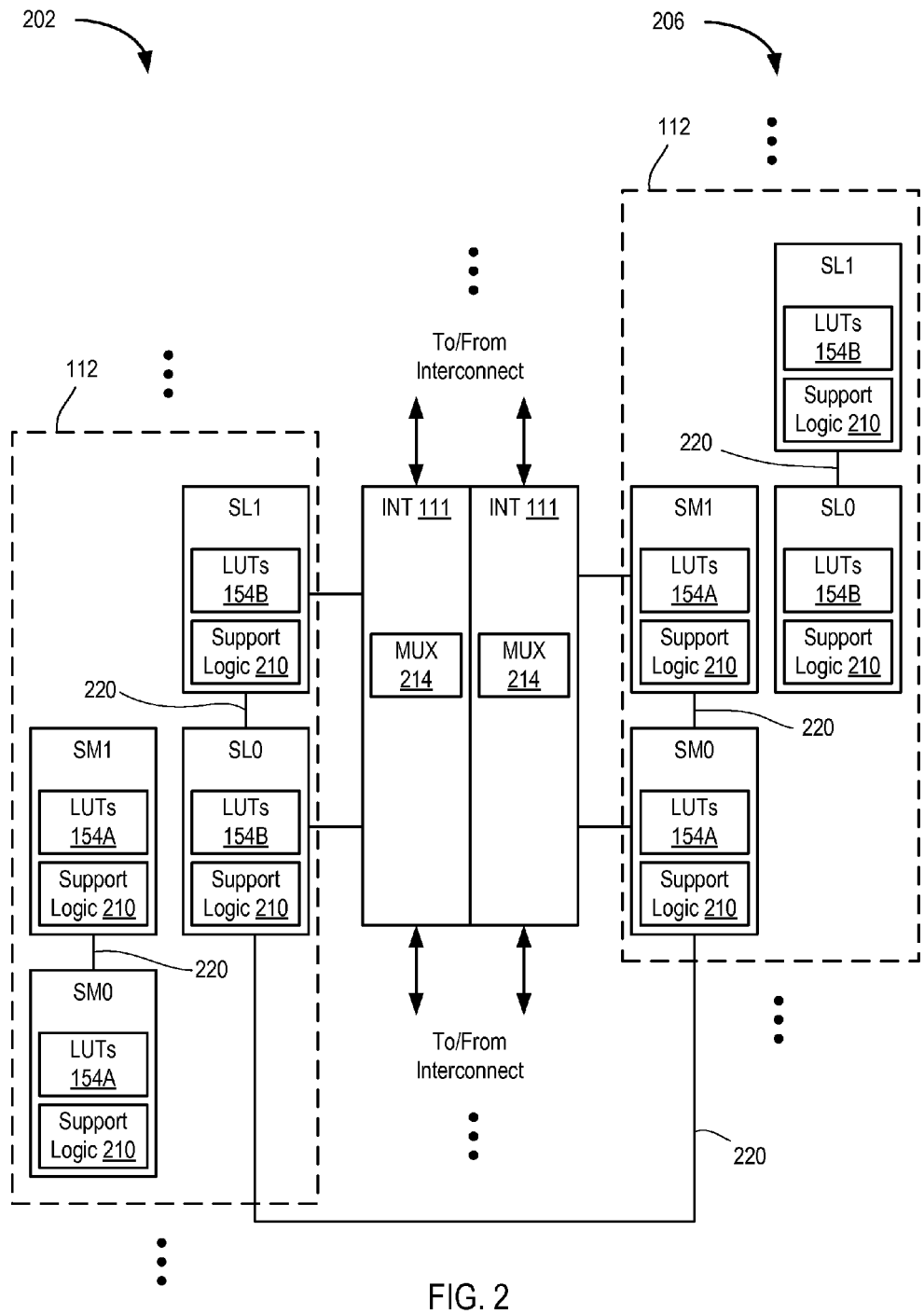
FIG. 2 is a block diagram depicting a portion of a floorplan of the programmable fabric of the FPGA of FIGS. 1A-1B.

FIG. 2 is a block diagram depicting a portion of a floorplan of the programmable fabric 150 of the FPGA 100. FIG. 2 shows two columns 202 and 206 of programmable tiles in the programmable fabric 150. The programmable tiles in the columns 202 and 206 comprise CLEs 112. In each of the columns 202 and 206, only one CLE 112 is shown, but the columns 202 and 206 generally include a plurality of CLEs. Each of the CLEs 112 is coupled to an interconnect element 111.

Each of the CLEs 112 comprises four slices SM0-SM1 and SL0-SL1. The slices SM0-SL1 are of one type (type "M"), the slices SL0-SL1 are of another type (type "L"). The type "M" slices SM0 and SM1 include LUTs 154A and support logic 210. The LUTs 154A can be configured as function generators to perform any combinatorial function having a plurality of inputs and a plurality of outputs. The LUTs 154A can also be configured as a LUT-RAM configured to store a plurality of bits. The support logic 210 can include flip-flops, multiplexers, carry-chain logic, and the like that support the LUTs 154A. The type "L" slices SL0 and SL1 include LUTs 154B and support logic 210. The LUTs 154B can be configured as function generators, but not as LUT-RAM. The architecture shown in FIG. 2 is just one example. In other examples, all LUTs in a CLE 112 can comprise LUT-RAMs (every slice is of type "M"), or all LUTs in a CLE 112 can comprise LUTs that cannot be configured as a RAM (every slice is of type "L").

Both types of LUTs 154A and 154B can have cascading connections 220. The cascading connections 220 enable LUT-to-LUT connections without using the programmable interconnect (e.g., INT 111 and MUX 214). The cascading connections 220 are shown generally in FIG. 2 as inter-slice connections (e.g., LUT-to-LUT connections between LUTs in two different slices). The cascading connections 220 can also be inter-CLE connections (e.g., between LUTs in two different CLEs 112). The cascading connections 220 can also be intra-slice connections (e.g., LUT-to-LUT connections between LUTs in the same slice).

In the example, the type "L" slices SL0 and SL1 in the column 202 are adjacent the type "M" slices SM0 and SM1 in the column 206 having two interconnect elements 111 therebetween. The slices SL0-SL1 in the column 202 are coupled to one of the interconnect elements 111, and the slices SM0-SM1 in the column 206 are coupled to another of the interconnect elements 111. The interconnect elements 111 can be coupled to each other. Each of the interconnect elements 111 includes multiplexers 214. Different ones of the multiplexers 214 can have different inputs, such as inputs from the CLE 112 in the column 202, inputs from the CLE 112 in the column 206, inputs from multiplexers 214 in another interconnect element 111, or inputs from the interconnect. Likewise, different ones of the multiplexers 214 can have different outputs, such as outputs to the CLE 112 in the column 202, outputs to the CLE 112 in the column 206, outputs to another interconnect element 111, or outputs to the interconnect.

Figure 3:
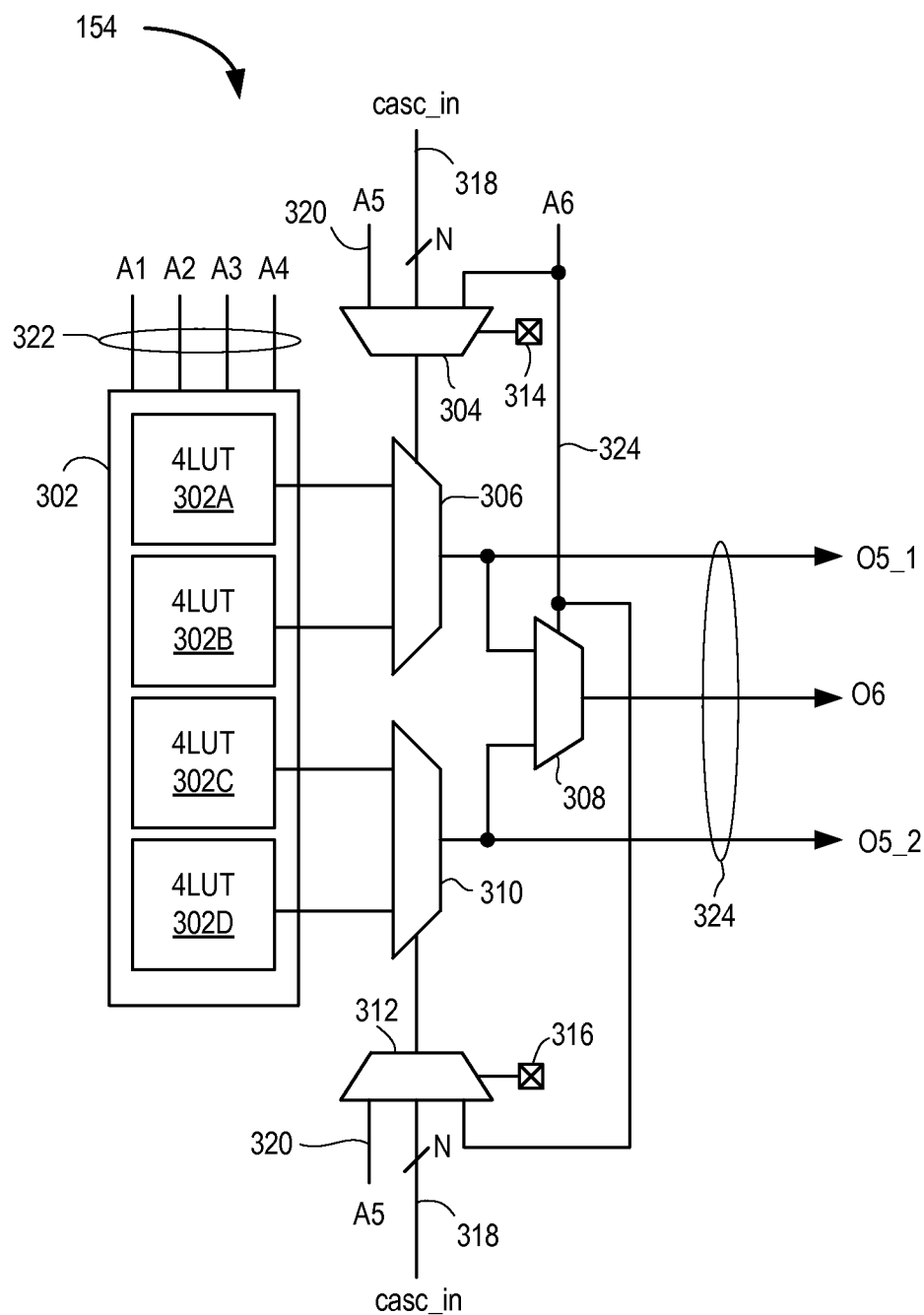
FIG. 3 is a block diagram depicting a LUT according to an example.

FIG. 3 is a block diagram depicting a LUT 154 according to an example. The LUT 154 includes LUT logic 302, a multiplexer 304, a multiplexer 306, a multiplexer 308, a multiplexer 310, and a multiplexer 312. The LUT 154 includes six inputs designated A1 through A6. The LUT 154 also includes a cascading input designated casc_in. The cascading input can be a single input or can be a bus of signals. In general, the cascading input includes N bits or signals, where N is a positive integer. The LUT 154 includes outputs designated O5_1, O5_2, and O6.

The LUT logic 302 includes four 4-input LUTs 302A, 302B, 302C, and 302D. In an example, the LUT logic 302 can include at least four LUTs 302. A 4-input LUT is also referred to herein as a "4LUT." Each 4LUT 302A-302D is coupled to common input terminals 322. Input terminals 322 provide the inputs A1, A2, A3, and A4 to each of the 4LUTs 302A-302D. An output of the 4LUT 302A is coupled to an input of the multiplexer 306, and an output of the 4LUT 302B is coupled to another input of the multiplexer 306. Together, the 4LUTs 302A and 302B comprise a first half of the LUT 154. An output of the 4LUT 302C is coupled to an input of the multiplexer 310, and an output of the 4LUT 302D is coupled to another input of the multiplexer 310. Together, the 4LUTs 302C and 302D comprise a second half of the LUT 154. An output of the multiplexer 306 provides the output O5_1 (output of the first half of the LUT 154), and an output of the multiplexer 310 provides the output O5_2 (output of the second half of the LUT 154).

The output of the multiplexer 306 is also coupled to an input of the multiplexer 308, and the output of the multiplexer 310 is also coupled to another input of the multiplexer 308. An output of the multiplexer 308 provides the output O6 of the LUT 154. Together, the outputs O5_1, O5_2, and O6 are provided by output terminals 324 of the LUT 154. One or more of the output terminals 324 can be coupled to casc_in of one or more additional LUTs in the FPGA. The multiplexer 308 is also referred to herein as the "output multiplexer."

An output of the multiplexer 304 is coupled to a control input of the multiplexer 306. One input of the multiplexer 304 is coupled to an input terminal 320, which provides the input A5 of the LUT 154. Another input of the multiplexer 304 is coupled to an input terminal 324, which provides the input A6 of the LUT 154. One or more additional input terminals of the multiplexer 304 is/are coupled to input 318, which provides casc_in. A control input of the multiplexer 304 is coupled to a control terminal 314. The control terminal 314 can receive a signal from another circuit in the FPGA, such as a memory (e.g., BRAM, LUTRAM, configuration memory, etc.).

An output of the multiplexer 312 is coupled to a control input of the multiplexer 310. One input of the multiplexer 312 is coupled to the input terminal 320, which provides the input A5 of the LUT 154. Another input of the multiplexer 312 is coupled to the input terminal 324, which provides the input A6 of the LUT 154. One or more additional input terminals of the multiplexer 312 is/are coupled to the input 318, which provides casc_in. A control input of the multiplexer 312 is coupled to a control terminal 316. The control terminal 316 can receive a signal from another circuit in the FPGA, such as a memory (e.g., BRAM, LUTRAM, configuration memory, etc.). The multiplexers 304 and 312 are also referred to herein as "cascading multiplexers."

In operation, each of the 4LUTs 302A-302D can implement an arbitrary 4-input function based on inputs A1-A4. The multiplexer 306 selects output from one of 4LUT 302A or 4LUT 302B as the output O5_1 for the first half of the LUT 154. The multiplexer 310 selects output from one of 4LUT 302C or 4LUT 302D as the output O5_2 for the second half of the LUT 154. In this manner, the LUT 154 can implement two 5-input LUTs that can be used to implement two 5-input functions. The multiplexer 308 selects among the outputs of the multiplexers 306 and 310 to provide the output O6 of the LUT 154. Thus, the LUT 154 can implement one 6-input LUT that can be used to implement a 6-input function.

In one configuration, multiplexers 304 and/or 312 can select input A5 to control the multiplexers 306 and/or 310, respectively. In another configuration, multiplexers 304 and/or 312 can select input A6 to control the multiplexers 306 and/or 310, respectively. In yet another configuration, multiplexers 304 and/or 312 can select one of the casc_in input(s) to control the multiplexers 306 and/or 310, respectively. The inputs 318 can be coupled to one or more output terminals of one or more other LUTs in the FPGA. In this manner, the LUT 154 can be directly coupled to one or more other LUTs in the FPGA through casc_in. As such, LUTs 154 can be chained together to synthesize multi-level functions, some examples of which are described below.

Multiplexing the casc_in input with the A5 input has the advantages of not increasing the delay on the fastest LUT input, and enabling different signals to feed top and bottom halves of the LUT. The multiplexers 304 and 312 allow for the creation of fast LUT-to-LUT connections by connection the output of one LUT to the casc_in of another LUT. In some examples, the casc_in input can include a plurality of signals. In such an example, the top half of the LUT 154 can use a different casc_in signal than the bottom half of the LUT 154, allowing for the implementation of wide multiplexer trees.

The LUT 154 shown in FIG. 3 can be scaled to provide a different number of LUTs and inputs. For example, LUT logic 302 can include more than four LUTs, and the LUTs in LUT logic 302 can include more than four inputs. The multiplexers 306 and 310 are part of multiplexing logic that selects among outputs of the LUTs in the LUT logic 302. In some examples, such multiplexing logic can include more than two multiplexers, each coupled to a cascading multiplexer. As such, while two cascading multiplexers 304 and 312 are shown, the LUT 154 can include a plurality of cascading multiplexers.

Figure 4:
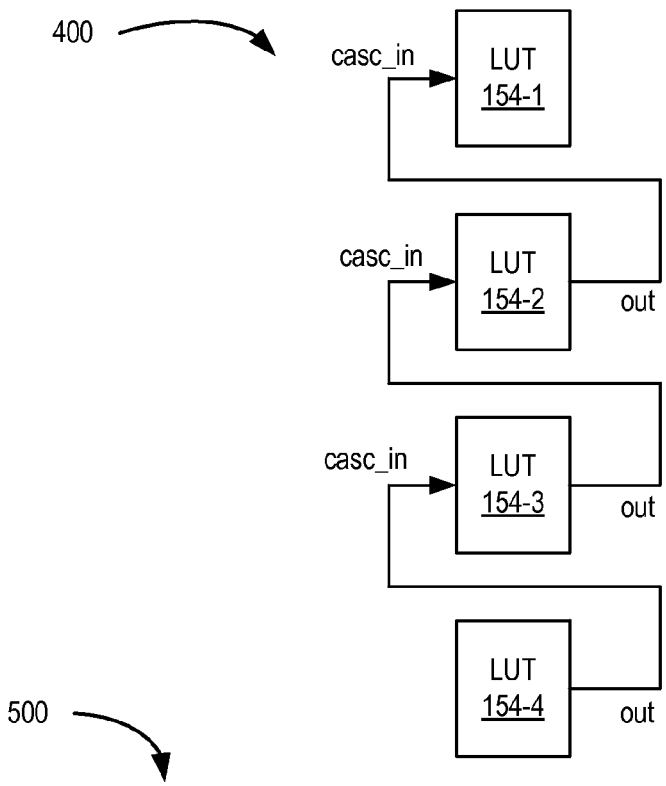
FIG. 4 is a block diagram depicting an example circuit comprising a chain of LUTs that implement a wide combinatorial function.

FIG. 4 is a block diagram depicting an example circuit 400 comprising a chain of LUTs 154-1 through 154-4. The casc_in input of the LUT 154-1 is coupled to an output of the LUT 154-2. The casc_in input of the LUT 154-2 is coupled to an output of the LUT 154-3. The casc_in input of the LUT 154-3 is coupled to an output of the LUT 154-4. The multiplexer 304 and/or the multiplexer 312 in each of the LUTs 154-1 through 154-3 to select the respective outputs of the LUTs 154-2 through 154-4 at the casc_in inputs. In the example of FIG. 3, each LUT 154-1 through 154-3 includes five other inputs A1-A4 and A6 that can be used in addition to casc_in. The LUT 154-4 includes six inputs A1-A6 that can be used. As such, the circuit 400 can implement a 21-input function, the output of which is provided by the LUT 154-1. In other examples, the LUTs 154 can have a different number of input terminals, but in general the cascading inputs can be used to cascade LUTs and implement a wide combinatorial function.

Figure 5:
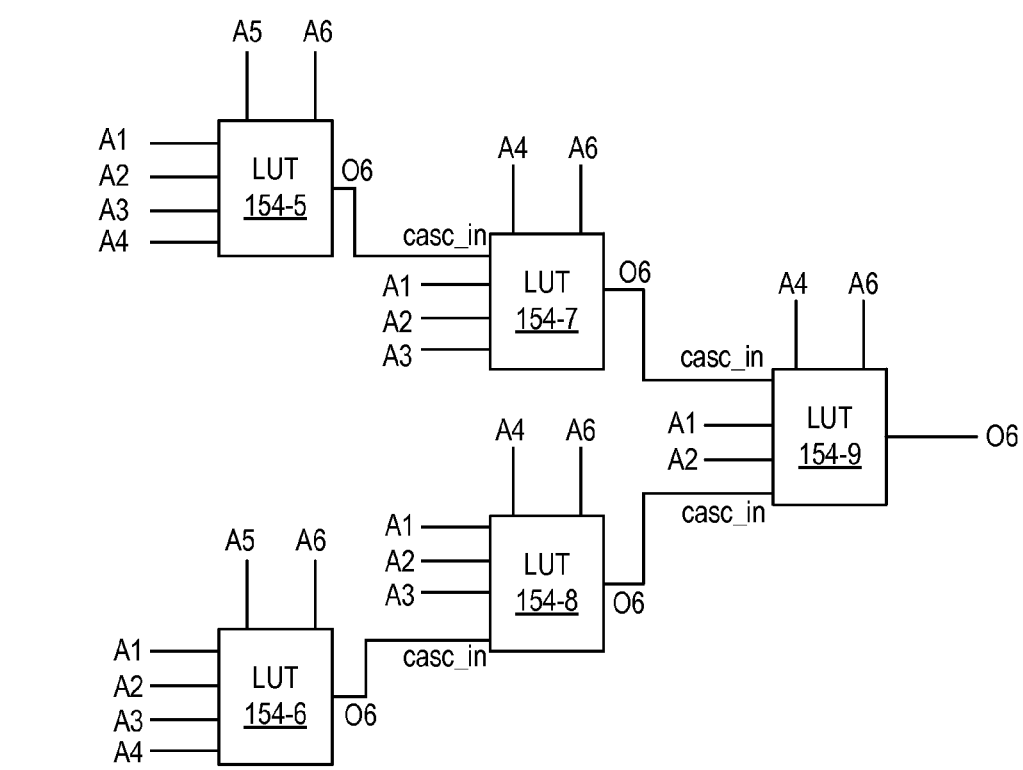
FIG. 5 is a block diagram depicting an example circuit 500 comprising a plurality of LUTs that implement a multiplexer.

FIG. 5 is a block diagram depicting an example circuit 500 comprising a plurality of LUTs 154-5 through 154-9. Assuming an implementation as shown in FIG. 3, the circuit 500 implements a 16:1 multiplexer. Inputs of the 16:1 multiplexer include inputs A1 through A4 of the LUT 154-5, inputs A1 through A4 of the LUT 154-6, inputs A1 through A3 of the LUT 154-7, inputs A1 through A3 of the LUT 154-8, and inputs A1 and A2 of the LUT 154-9. An output of the 16:1 multiplexer is provided by the output O6 of the LUT 154-9. The control input of the 16:1 multiplexer comprises inputs A5-A6 of the LUT 154-5, inputs A5-A6 of the LUT 154-6, inputs A4 and A6 of the LUT 154-7, inputs A4 and A6 of the LUT 154-8, and inputs A4 and A6 of the LUT 154-9. The output O6 of the LUT 154-5 is coupled to the casc_in input of the LUT 154-7. The output O6 of the LUT 154-6 is coupled to the casc_in input of the LUT 154-8. Outputs O6 of the LUTs 154-7 and 154-8 are coupled to the casc_in input of the LUT 154-9. The present example assumes that the casc_in input of the LUT 154-9 is a bus comprising a plurality of signals.

The circuits 400 and 500 of FIGS. 4 and 5 are just two examples of the types of circuits that can be formed using LUTs having cascading inputs as described herein. In general, as shown in the example of FIG. 3, each LUT can include a casc_in input having one or more bits or signals. As such, each LUT can be coupled to one or more additional LUTs. The additional LUTs can be located in the same slice, in adjacent slice(s), and/or in adjacent CLE(s). A set of cascaded LUTs can be used to form wider versions of combinatorial functions, multiplexers, and the like that can be formed using a single LUT.

Figure 6:
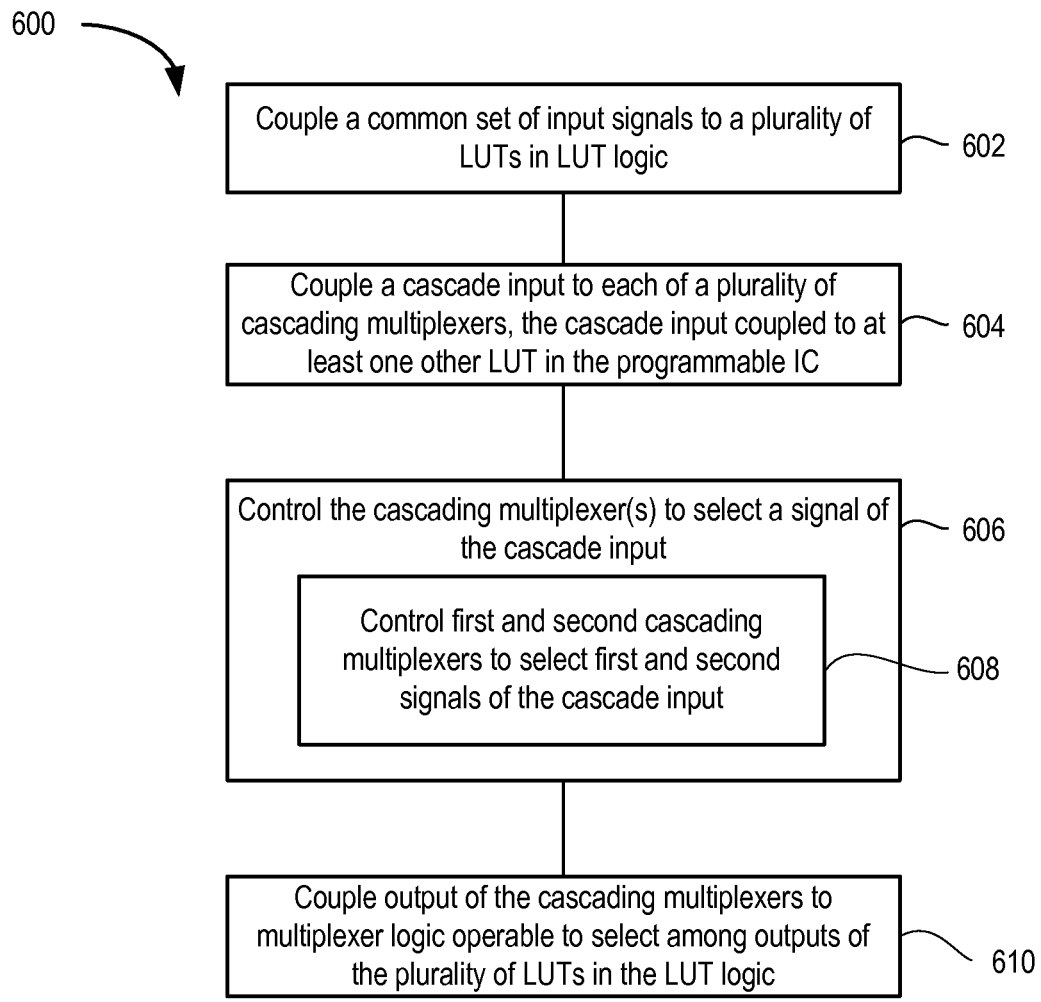
FIG. 6 is a flow diagram depicting a method of operating a LUT in a programmable IC according to an example.

FIG. 6 is a flow diagram depicting a method 600 of operating a LUT in a programmable IC according to an example. The method 600 begins at step 602, where a common set of input signals are coupled to a plurality of LUTs in LUT logic. For example, as shown in FIG. 3, inputs A1 through A4 are coupled to LUTs 302A through 302B.

At step 604, a cascade input is coupled to each of a plurality of cascading multiplexers, where the cascade input is coupled to at least one other LUT in the programmable IC. For example, as shown in FIG. 3, the input casc_in is coupled to multiplexers 304 and 312 in the LUT 154.

At step 606, at least one of the cascading multiplexers is controlled to select a signal of the cascade input. For example, either or both of the multiplexers 304 and 312 can be controlled to select a signal of casc_in. In an example, the multiplexers 304 and 312 can be controlled using a memory in the programmable IC, such as configuration memory.

At step 608, first and second cascading multiplexers are controlled to select first and second signals of the cascade input. The first signal can be different from the second signal. For example, as shown in FIG. 3, the casc_in input can be a bus having a plurality of signals, and the multiplexer 304 can select one of the casc_in signals, while the multiplexer 312 selects another of the casc_in signals.

At step 610, output of the cascading multiplexers is coupled to multiplexer logic to select among outputs of the plurality of LUTs in the LUT logic. For example, as shown in FIG. 3, the outputs of the multiplexers 304 and 312 are coupled to multiplexers 306 and 310 to select among the outputs of the LUTs 302A through 302D.

While the foregoing is directed to specific examples, other and further examples may be devised without departing from the basic scope thereof, and the scope thereof is determined by the claims that follow.

What is claimed is:

1. A look-up table (LUT) for a programmable integrated circuit (IC), comprising:
   a plurality of input terminals;
   a cascading input coupled to at least one other LUT in the programmable IC;
   LUT logic having a plurality of LUTs each coupled to a common set of the input terminals;
   a plurality of multiplexers having inputs coupled to outputs of the plurality of LUTs;
   an output multiplexer having inputs coupled to outputs of the plurality of multiplexers; and
   a plurality of cascading multiplexers each having an output coupled to a control input of a respective one of the plurality of multiplexers, each of the plurality of cascading multiplexers comprising a plurality of inputs, at least one of the plurality of inputs coupled to the cascading input, wherein the LUT comprises a plurality of output terminals coupled to the outputs of the plurality of multiplexers and the output multiplexer.

2. The LUT of claim 1, wherein:
   the plurality of LUTs comprise at least four LUTs;
   the plurality of multiplexers comprise at least two multiplexers coupled to the at least four LUTs; and
   the plurality of cascading multiplexers comprise at least two cascading multiplexers coupled to control the at least two multiplexers.

3. The LUT of claim 2, wherein:
   each of the at least four LUTs comprises a 4-input LUT;
   the plurality of input terminals comprises four inputs coupled to each of the 4-input LUTs.

4. The LUT of claim 1, wherein at least one of the plurality of inputs of each of the plurality of cascading multiplexers is coupled to at least one of the plurality of input terminals.

5. The LUT of claim 1, wherein the cascading input comprises a bus having a plurality of signals.

6. The LUT of claim 1, wherein control inputs of the plurality of cascading multiplexers are coupled to memory in the programmable IC.

7. The LUT of claim 6, wherein the memory comprises configuration memory of the programmable IC.

8. The LUT of claim 1, wherein a control input of the output multiplexer is coupled to a terminal of the plurality of input terminals.

9. A programmable IC, comprising:
   a configuration memory; and at least one configurable logic element (CLE), coupled to the configuration memory, having a plurality of look-up tables (LUTs), each of the plurality of LUTs including an output terminal and a cascading input;
wherein a cascading input of a first LUT of the plurality of LUTs is coupled to the output terminal of a second LUT of the plurality of LUTs; wherein each of the plurality of LUTs further comprises:
  a plurality of input terminals;
  LUT logic having a plurality of LUTs each coupled to a common set of the input terminals;
  a plurality of multiplexers having inputs coupled to outputs of the plurality of LUTs;
  an output multiplexer having inputs coupled to outputs of the plurality of multiplexers and an output coupled to the output terminal;
  a plurality of cascading multiplexers each having an output coupled to a control input of a respective one of the plurality of multiplexers, each of the plurality of cascading multiplexers comprising a plurality of inputs, at least one of the plurality of inputs coupled to the cascading input; and
  wherein the LUT comprises a plurality of output terminals coupled to the outputs of the plurality of multiplexers and the output multiplexer.

10. The programmable IC of claim 9, wherein, for each of the plurality of LUTs, at least one of the plurality of inputs of each of the plurality of cascading multiplexers is coupled to at least one of the plurality of input terminals.

11. The programmable IC of claim 9, wherein, for each of the plurality of LUTs, the cascading input comprises a bus having a plurality of signals.

12. The programmable IC of claim 9, wherein, for each of the plurality of LUTs, control inputs of the plurality of cascading multiplexers are coupled to memory in the programmable IC.

13. The programmable IC of claim 12, wherein the memory comprises the configuration memory.

14. The programmable IC of claim 9, wherein, for each of the plurality of LUTs, a control input of the output multiplexer is coupled to a terminal of the plurality of input terminals.

15. The programmable IC of claim 9, wherein the first LUT and the second LUT are configured to implement a combinatorial function.

16. The programmable IC of claim 9, wherein the first LUT and the second LUT are configured to implement a multiplexer.

17. A method of operating a look-up table (LUT) in a programmable integrated circuit (IC), comprising:
  coupling a common set of input signals to a plurality of LUTs in LUT logic;
  coupling a cascade input to each of a plurality of cascading multiplexers, the cascade input coupled to at least one other LUT in the programmable IC;
  controlling at least one of the plurality of cascading multiplexers to select a signal of the cascade input; and
  coupling output of the cascading multiplexers to multiplexer logic operable to select among outputs of the plurality of LUTs in the LUT logic, wherein the LUT comprises a plurality of output terminals coupled to the outputs of the plurality of multiplexers and the output multiplexer.

18. The method of claim 17, wherein the operation of controlling comprises:
  controlling a first cascading multiplexer of the plurality of multiplexers to select a first signal of the cascade input; and
  controlling a second cascading multiplexer of the plurality of multiplexers to select a second signal of the cascade input different than the first signal.

* * * * *